US008847605B2

(12) United States Patent
Morita (10) Patent No.: US 8,847,605 B2
(45) Date of Patent: Sep. 30, 2014

(54) CONNECTION DIAGNOSTIC APPARATUS FOR GROUND FAULT DETECTOR (75) Inventor: Tsuyoshi Morita, Zama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 405 days.

(21) Appl. No.: 13/263,251

(22) PCT Filed: May 19, 2010

(86) PCT No.: PCT/JP2010/058855
§ 371 (c)(1),
(2), (4) Date: Oct. 6, 2011

(87) PCT Pub. No.: WO2010/143534
PCT Pub. Date: Dec. 16, 2010

(65) Prior Publication Data
US 2012/0025844 A1   Feb. 2, 2012

(30) Foreign Application Priority Data

Jun. 12, 2009   (JP) ................................ 2009-140927

(51) Int. Cl.
*G01R 31/04* (2006.01)
*G01R 31/14* (2006.01)
*B60L 3/00* (2006.01)
*G01R 31/00* (2006.01)
*G01R 31/02* (2006.01)

(52) U.S. Cl.
CPC ............... *G01R 31/04* (2013.01); *B60L 3/0023* (2013.01); *G01R 31/025* (2013.01)
USPC ............. 324/538; 324/509; 324/512; 702/58; 361/42

(58) Field of Classification Search
CPC .............................. G01R 31/025; G01R 27/18
USPC .................. 324/500–545; 702/58–66; 361/42
See application file for complete search history.

(56) References Cited

U.S. PATENT DOCUMENTS

| 5,065,104 A * | 11/1991 | Kusko et al. .................. 324/508 |
| 7,978,446 B2 * | 7/2011 | Lindsey .......................... 361/42 |
| 2007/0008666 A1 * | 1/2007 | Morita et al. ................... 361/42 |

(Continued)

FOREIGN PATENT DOCUMENTS

| CN | 101277072 A | 10/2008 |
| JP | 10-144194 A | 4/1998 |

(Continued)

OTHER PUBLICATIONS

Chinese Office Action dated Sep. 4, 2013, (6 pgs.).

*Primary Examiner* — Jermele M Hollington
*Assistant Examiner* — Emily Chan
(74) *Attorney, Agent, or Firm* — Foley & Lardner LLP (57) ABSTRACT A connection diagnostic apparatus for a ground fault detector including an oscillator connected via a coupling capacitor to an electric circuit with a first connection line and a second connection line, and a voltage detector for detecting a voltage value between the oscillator and the coupling capacitor is provided with a first relay and a second relay provided in the first connection line and the second connection line, and a programmable controller. The programmable controller determines a connected state of the ground fault detector based on a change amount of a voltage value detected by the voltage detector when the first relay is turned on or off and determines the connected state of the ground fault detector based on a change amount of a voltage value detected by the voltage detector when the second relay is turned on or off.

5 Claims, 8 Drawing Sheets

(56) References Cited

U.S. PATENT DOCUMENTS

| | | | |
|---|---|---|---|
| 2007/0188948 A1* | 8/2007 | Morita | 361/42 |
| 2009/0134881 A1* | 5/2009 | Tachizaki | 324/551 |

FOREIGN PATENT DOCUMENTS

| | | |
|---|---|---|
| JP | 10-221395 A | 8/1998 |
| JP | 2004-361309 A | 12/2004 |
| JP | 2005-149843 A | 6/2005 |
| JP | 2005-192324 A | 7/2005 |
| JP | 2005-233822 A | 9/2005 |
| JP | 2006-177840 A | 7/2006 |
| JP | 2007-329045 A | 12/2007 |
| JP | 2008-245465 A | 10/2008 |
| JP | 2009-140927 A | 6/2009 |

* cited by examiner

FIG. 1

FIG. 2A  THIRD RELAY (RC)
FIG. 2B  SECOND RELAY (R−)
FIG. 2C  FIRST RELAY (R+)
FIG. 2D  VOLTAGE VALUE V1

CONNECTION DIAGNOSTIC APPARATUS FOR GROUND FAULT DETECTOR

TECHNICAL FIELD

This invention relates to an apparatus for diagnosing a connected state of a ground fault detector connected to an electric circuit.

BACKGROUND ART

JP1998-221395A issued in 1998 by the Japan Patent Office discloses a ground fault detector diagnostic apparatus including an electric circuit for electrically connecting a battery and a vehicle travel motor, a ground fault detector for detecting a ground fault in the electric circuit and a ground circuit capable of grounding the electric circuit and a vehicle body. This ground fault detector diagnostic apparatus causes a temporary ground fault of the electric circuit by the ground circuit and diagnoses a failure and the like of the ground fault detector based on whether or not the ground fault detector detects this pseudo-ground fault.

SUMMARY OF INVENTION

However, the above ground fault detector diagnostic apparatus has problems that the construction is relatively complicated since a pseudo-ground fault needs to be generated by the ground circuit and a ground fault constantly occurs in the event of a failure of the ground circuit.

Accordingly, an object of this invention is to provide a connection diagnostic apparatus for a ground fault detector capable of diagnosing a connected state between an electric circuit and a ground fault detector by a simple construction.

This invention is directed to a connection diagnostic apparatus for a ground fault detector including an oscillator which generates a pulse signal and is connected via a coupling capacitor to an electric circuit with a first connection line for connecting a positive electrode of a power supply and a load and a second connection line for connecting a negative electrode of the power supply and the load, and a voltage detector for detecting a voltage value of the pulse signal between the oscillator and the coupling capacitor. The connection diagnostic apparatus comprises a first relay provided in the first connection line, a second relay provided in the second connection line, and a programmable controller. The programmable controller turns on or off the first relay, determines whether or not the ground fault detector is normally connected to the electric circuit via the first relay based on a change amount of a voltage value detected by the voltage detector when the first relay is turned on or off, turns on or off the second relay, and determines whether or not the ground fault detector is normally connected to the electric circuit via the second relay based on a change amount of a voltage value detected by the voltage detector when the second relay is turned on or off.

The details as well as other features and advantages of this invention are set forth in the remainder of the specification and are shown in the accompanying drawings.

DESCRIPTION OF EMBODIMENTS

With reference to FIGS. 1 to 6, a connection diagnostic apparatus for a ground fault detector for an electric vehicle according to a first embodiment of this invention is described.

Figure 1:
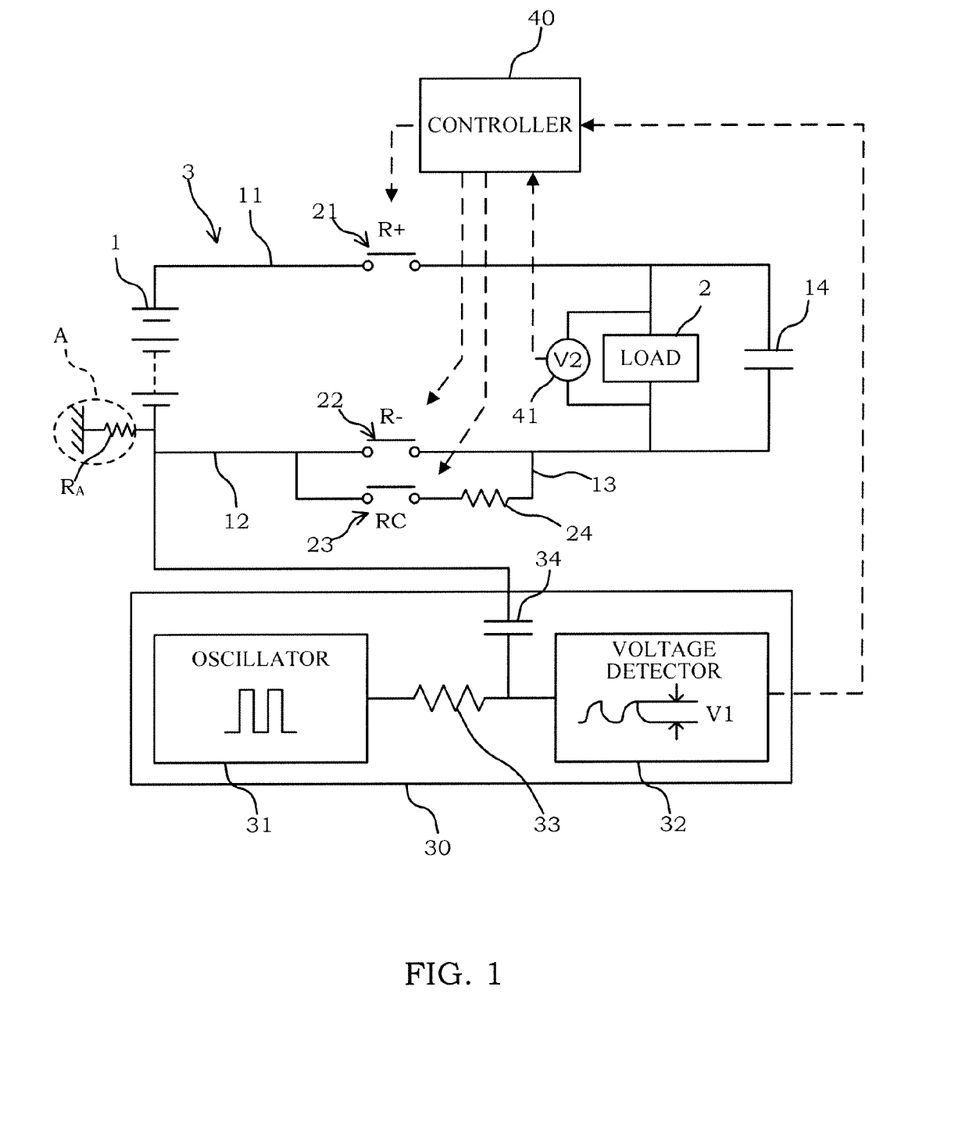
FIG. 1 is a circuit diagram of a connection diagnostic apparatus for a ground fault detector according to a first embodiment of this invention.

As shown in FIG. 1, the electric vehicle includes a battery 1 as a direct-current power supply having a high output and a load 2 such as a travel drive motor. The battery 1 and the load 2 are electrically connected by a strong electric circuit 3.

The strong electric circuit 3 includes three connection lines 11 to 13 and a high-capacity smoothing capacitor 14 arranged in parallel to the load 2.

The first connection line 11 connects a positive electrode of the battery 1 and a positive electrode terminal of the load 2. A first relay 21 is provided in the first connection line 11.

The second connection line 12 connects a negative electrode of the battery 1 and a negative electrode terminal of the load 2. A second relay 22 is provided in the second connection line 12.

The third connection line 13 is so connected to the second connection line 12 as to bypass the second relay 22. A third relay 23 and a resistor 24 are provided in series in the third connection line 13. A resistance value of the resistor 24 is set based on a voltage of the battery 1 and a capacitance of the smoothing capacitor 14.

A ground fault detector 30 for detecting a ground fault in the strong electric circuit 3 is disposed in the above strong electric circuit 3. The ground fault detector 30 operates on power supplied from a low-output power supply different from the battery 1. The ground fault detector 30 includes an oscillator 31 for generating a rectangular pulse signal and a voltage detector 32.

The oscillator 31 is connected to the second connection line 12 between the negative electrode of the battery 1 and the second relay 22 via a resistor 33 and a coupling capacitor 34. The voltage detector 32 detects a crest value of the rectangular pulse signal generated from the oscillator 31 as a voltage value V1 by detecting a voltage between the resistor 33 and the coupling capacitor 34.

When insulation resistance of the strong electric circuit 3 decreases and a ground fault occurs between the strong electric circuit 3 and the vehicle body, a ground fault resistor $R_4$ is formed as shown in an area A encircled by a broken line, and the voltage value V1 detected by the voltage detector 32 decreases due to this ground fault resistor $R_4$. Accordingly, a ground fault in the strong electric circuit 3 can be detected by monitoring the voltage value V1 detected by the voltage detector 32 and detecting a voltage drop. A ground fault detection by the ground fault detector 30 is performed while the vehicle is running.

Note that a ground fault could occur not only at a position in the area A of FIG. 1, but also at any position of the strong electric circuit 3. If a ground fault occurs at any position of the strong electric circuit 3, an impedance of the strong electric circuit 3 changes. The ground fault detector 30 detects a change in the voltage value V1 of the rectangular pulse signal of the oscillator 31 caused by an impedance change resulting from a ground fault. Although the ground fault detector 30 is connected to the second connection line 12 between the negative electrode of the battery 1 and the second relay 22 in this embodiment, it may be connected to the first connection line 11 between the positive electrode of the battery 1 and the first relay 21.

A controller 40 is composed of a microcomputer including a central processing unit (CPU), a read-only memory (ROM), a random access memory (RAM) and an input/output interface (I/O interface). The controller 40 may be possibly composed of a plurality of microcomputers.

To the controller 40 are input signals from a voltage sensor 41 for detecting a both-end voltage at both ends of the load 2, the voltage detector 32 of the ground fault detector 30 and various other sensors for detecting a state of the vehicle. The controller 40 diagnoses a connected state of the ground fault detector 30 by switching the first to third relays 21 to 23 on or off based on these signals.

With reference to FIGS. 2A to 2D, the principle of a connection diagnosis of the ground fault detector 30 is described.

Figure 2A:
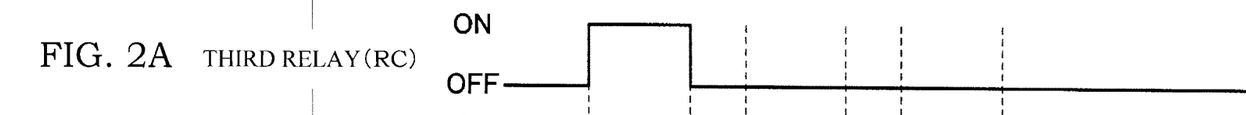
FIGS. 2A to 2D are timing charts showing changes in detected voltage values when relays according to the first embodiment are turned on and off.
Figures 2B, 2C:
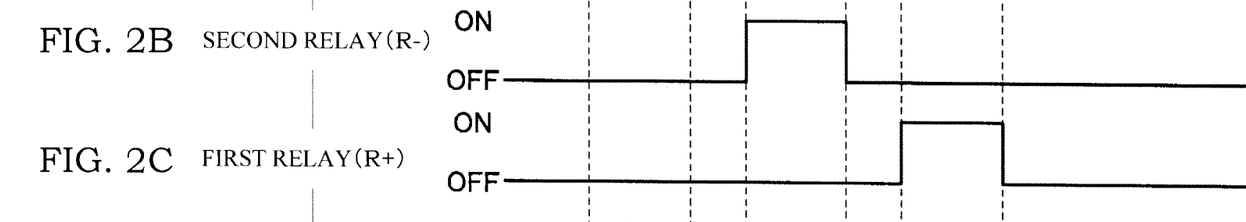
Figure 2D:
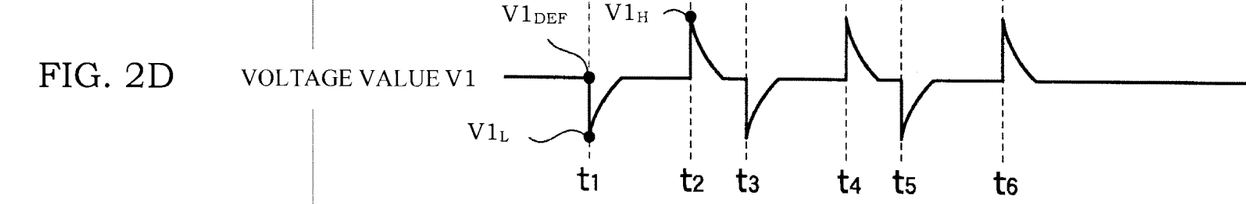

When the third relay 23 is turned on at time t1 in a state where the first to third relays 21 to 23 are off as shown in FIG. 2A, the voltage value V1 detected by the voltage detector 32 of the ground fault detector 30 temporarily decreases as shown in FIG. 2D. Since a parasitic capacitance is present in the strong electric circuit 3, an impedance in the strong electric circuit 3 temporarily increases due to the parasitic capacitance when the third relay 23 is on. Thus, the voltage value V1 detected by the voltage detector 32 deceases when the ground fault detector 30 is normally connected to the strong electric circuit 3 via the third relay 23. Accordingly, it can be judged whether or not the ground fault detector 30 is normally connected to the strong electric circuit 3 via the third relay 23 by calculating a voltage change amount $\Delta V_{RCON}$ from a difference between a reference voltage value $V1_{DEF}$ before the third relay 23 is turned on and a minimum voltage value $V1_L$ when the third relay 23 is turned on and comparing the voltage change amount $\Delta V_{RCON}$ and a determination value $\Delta V$.

When the third relay 23 is turned off at time t2 as shown in FIG. 2A, the voltage value V1 detected by the voltage detector 32 of the ground fault detector 30 temporarily increases as shown in FIG. 2D. Since the impedance in the strong electric circuit 3 temporarily decreases due to the parasitic capacitance when the third relay 23 is off, the voltage value V1 detected by the voltage detector 32 increases when the ground fault detector 30 is normally connected to the strong electric circuit 3 via the third relay 23. Accordingly, it can be judged whether or not the ground fault detector 30 is normally connected to the strong electric circuit 3 via the third relay 23 by calculating a voltage change amount $\Delta V_{RCOFF}$ from a difference between the reference voltage value $V1_{DEF}$ and a maximum voltage value $V1_H$ when the third relay 23 is off and comparing the voltage change amount $\Delta V_{RCOFF}$ and the determination value $\Delta V$.

When the second relay 22 is turned on at time t3 and turned off at time t4 as shown in FIG. 2B, the voltage value V1 temporarily decreases when the second relay 22 is turned on and temporarily increases when the second relay 22 is turned off as shown in FIG. 2D if the ground fault detector 30 is normally connected to the strong electric circuit 3 via the second relay 22. Accordingly, it can be judged whether or not the ground fault detector 30 is normally connected to the strong electric circuit 3 via the second relay 22 by detecting a voltage change amount $\Delta V_{R-ON}$ or $\Delta V_{R-OFF}$ when the second relay 22 is turned on or off.

Note that the voltage change amount $\Delta V_{R-ON}$ is calculated from a difference between the reference voltage value $V1_{DEF}$ and the minimum voltage value $V1_L$ when the second relay 22 is turned on, and the voltage change amount $\Delta V_{R-OFF}$ is calculated from a difference between the reference voltage value $V1_{DEF}$ and the maximum voltage value $V1_H$ when the second relay 22 is turned off.

When the first relay 21 is turned on at time t5 and turned off at time t6 as shown in FIG. 2C, the voltage value V1 temporarily decreases when the first relay 21 is turned on and temporarily increases when the first relay 21 is turned off as shown in FIG. 2D if the ground fault detector 30 is normally connected to the strong electric circuit 3 via the first relay 21. Accordingly, it can be judged whether or not the ground fault detector 30 is normally connected to the strong electric circuit 3 via the first relay 21 by detecting a voltage change amount $\Delta V_{R+ON}$ or $\Delta V_{R+OFF}$ when the first relay 21 is turned on or off.

Note that the voltage change amount $\Delta V_{R+ON}$ is calculated from a difference between the reference voltage value $V1_{DEF}$ and the minimum voltage value $V1_L$ when the first relay 21 is turned on, and the voltage change amount $\Delta V_{R+OFF}$ is calculated from a difference between the reference voltage value $V1_{DEF}$ and the maximum voltage value $V1_H$ when the first relay 21 is turned off.

Figure 3:
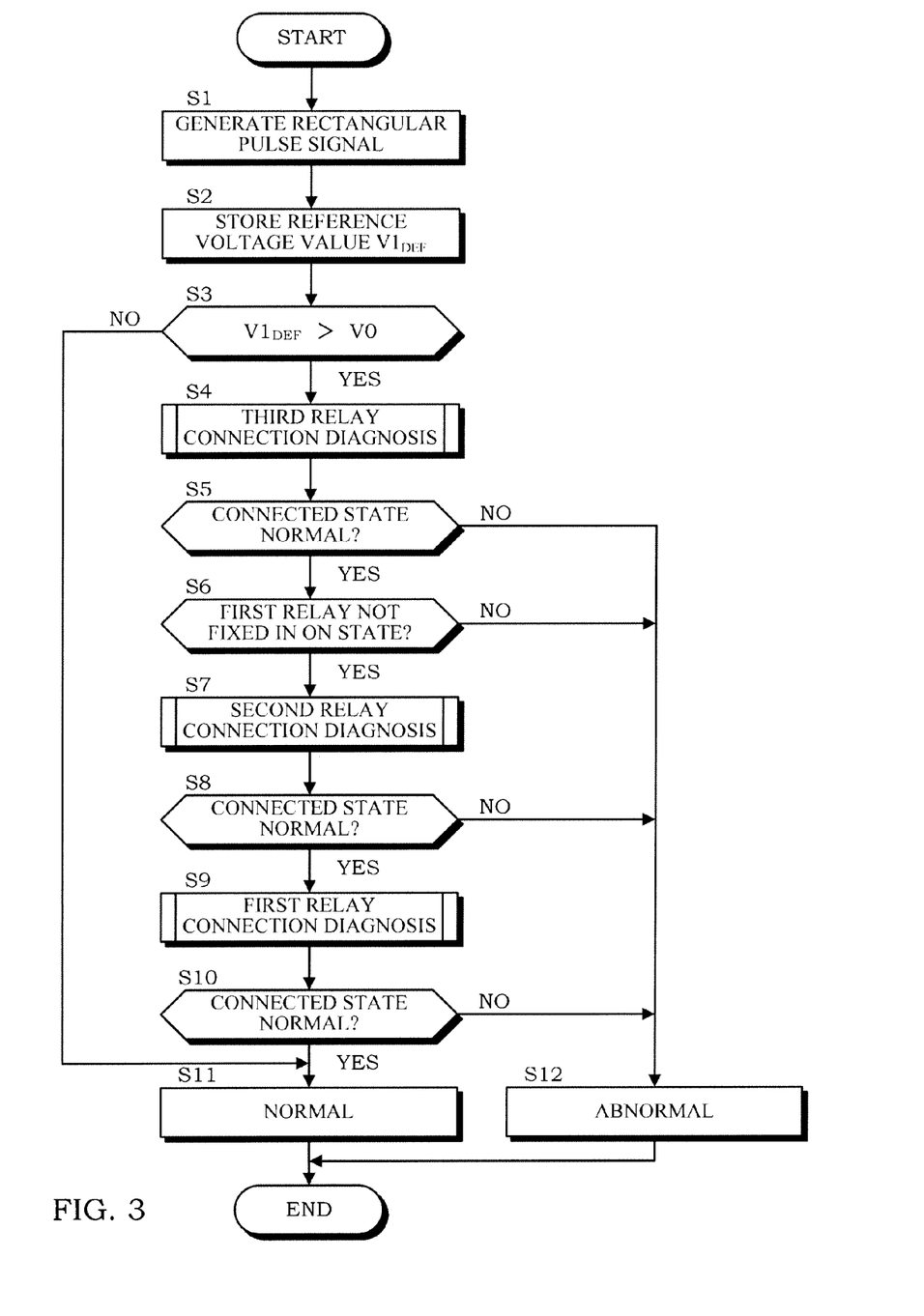
FIG. 3 is a flow chart showing a connection diagnosis routine executed by a controller according to the first embodiment.

Next, a connection diagnosis routine for the ground fault detector 30 executed by the controller 40 is described with reference to FIG. 3.

The connection diagnosis routine is executed at least at either one of an on-timing and an off-timing of a main switch of the electric vehicle. Before the execution of a connection diagnosis control, the first to third relays 21 to 23 are off.

In Step S1, the controller 40 controls the oscillator 31 of the ground fault detector 30 to generate a rectangular pulse signal.

In Step S2, the controller 40 stores the voltage value V1 detected by the voltage detector 32 of the ground fault detector 30 when the first to third relays 21 to 23 are off as the reference voltage value $V1_{DEF}$.

In Step S3, the controller 40 determines whether the reference voltage value $V1_{DEF}$ is higher than a predetermined ground fault determining voltage value V0. If the reference voltage value $V1_{DEF}$ is higher than the ground fault determining voltage value V0, the controller 40 performs the processing of Step S4.

If the reference voltage value $V1_{DEF}$ is lower than the ground fault determining voltage value V0, the controller 40 determines the occurrence of a ground fault in the battery 1 or in the strong electric circuit 3 near the battery 1. In the case of detecting the ground fault in this way, it means nothing more or less than that the ground fault detector 30 is normally connected to the strong electric circuit 3. Thus, the controller 40 performs the processing of Step S11 without performing a detailed connection diagnosis.

In Step S4, the controller 40 performs a third relay connection diagnosis. This diagnosis is executed by a subroutine shown in FIG. 4.

In Step S5, the controller 40 determines from the diagnosis result of Step S4 whether or not the ground fault detector 30 is normally connected to the strong electric circuit 3 via the third relay 23. In the case of normality, the controller 40 performs the processing of Step S6. In the case of abnormality, the controller 40 performs the processing of Step S12.

In Step S6, the controller 40 determines from the diagnosis result of Step S4 whether or not the first relay 21 is fixed in an on state. Unless the first relay 21 is fixed in the on state, the controller 40 performs the processing of Step S7. If the first relay 21 is fixed in the on state, the controller 40 performs the processing of Step S12.

In Step S7, the controller 40 performs a second relay connection diagnosis. This diagnosis is executed by a subroutine shown in FIG. 5.

In Step S8, the controller 40 determines from the diagnosis result of Step S7 whether or not the ground fault detector 30 is normally connected to the strong electric circuit 3 via the second relay 22. In the case of normality, the controller 40 performs the processing of Step S9. In the case of abnormality, the controller 40 performs the processing of Step S12.

In Step S9, the controller 40 performs a first relay connection diagnosis. This diagnosis is executed by a subroutine shown in FIG. 6.

In Step S10, the controller 40 determines from the diagnosis result of Step S9 whether or not the ground fault detector 30 is normally connected to the strong electric circuit 3 via the first relay 21. In the case of normality, the controller 40 performs the processing of Step S11. In the case of abnormality, the controller 40 performs the processing of Step S12.

In Step S11, the controller 40 diagnoses the connection between the ground fault detector 30 and the strong electric circuit 3 as normal and ends the process.

In Step S12, the controller 40 diagnoses the connection between the ground fault detector 30 and the strong electric circuit 3 as abnormal, notifies connection abnormality to an operator and ends the process.

Figure 4:
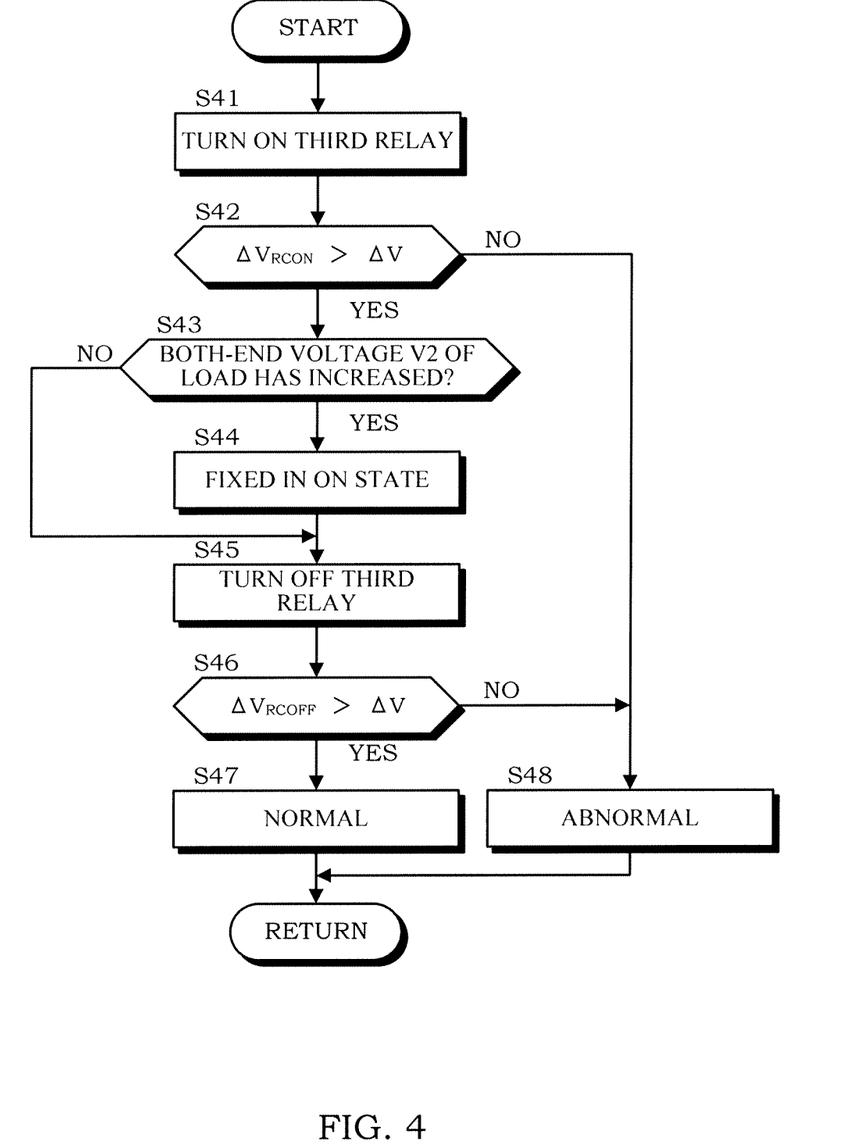
FIG. 4 is a flow chart showing a third relay connection diagnosis subroutine executed by the controller.

A third relay connection diagnosis subroutine is described with reference to FIG. 4.

In Step S41, the controller 40 switches the third relay 23 from off to on.

In Step S42, the controller 40 determines whether or not the voltage change amount $\Delta V_{RCON}$ when the third relay 23 is turned on is larger than the determination value $\Delta V$. The voltage change amount $\Delta V_{RCON}$ is calculated by subtracting the minimum voltage value $V1_L$ when the third relay 23 is turned on from the reference voltage value $V1_{DEF}$.

If the voltage change amount $\Delta V_{RCON}$ is larger than the determination value $\Delta V$, the controller 40 performs the processing of Step S43. If the voltage change amount $\Delta V_{RCON}$ is smaller than the determination value $\Delta V$, the controller 40 performs the processing of Step S48 and determines that the ground fault detector 30 is not normally connected via the third relay 23.

In Step S43, the controller 40 determines whether or not a both-end voltage V2 of the load 2 detected by the voltage sensor 41 has increased when the third relay 23 is turned on.

The both-end voltage V2 of the load 2 increases when the third relay 23 is turned on in the case where the first relay 21 is fixed in the on state. Accordingly, when the both-end voltage V2 has increased, the controller 40 performs the processing of Step S44 and determines that the first relay 21 is fixed in the on state.

On the contrary, unless the both-end voltage V2 has increased, the controller 40 performs the processing of Step S45.

In Step S45, the controller 40 switches the third relay 23 from on to off.

In Step S46, the controller 40 determines whether or not the voltage change amount $\Delta V_{RCOFF}$ when the third relay 23 is turned off is larger than the determination value $\Delta V$. The voltage change amount $\Delta V_{RCOFF}$ is calculated by subtracting the reference voltage value $V1_{DEF}$ from the maximum voltage value $V1_H$ when the third relay 23 is turned off.

If the voltage change amount $\Delta V_{RCOFF}$ is larger than the determination value $\Delta V$, the controller 40 performs the processing of Step S47. If the voltage change amount $\Delta V_{RCOFF}$ is smaller than the determination value $\Delta V$, the controller 40 performs the processing of Step S48.

In Step S47, the controller 40 determines that the ground fault detector 30 is normally connected via the third relay 23.

In Step S48, the controller 40 determines that the ground fault detector 30 is not normally connected via the third relay 23.

Figure 5:
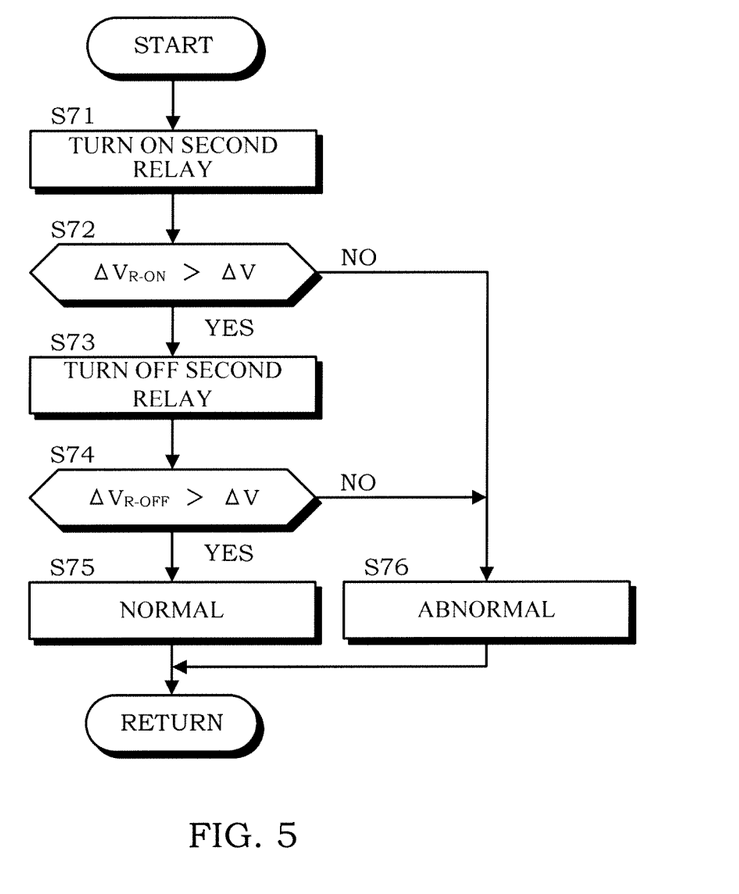
FIG. 5 is a flow chart showing a second relay connection diagnosis subroutine executed by the controller.

A second relay connection diagnosis subroutine is described with reference to FIG. 5.

In Step S71, the controller 40 switches the second relay 22 from off to on.

In Step S72, the controller 40 determines whether or not the voltage change amount $\Delta V_{R-ON}$ when the second relay 22 is turned on is larger than the determination value $\Delta V$. The voltage change amount $\Delta V_{R-ON}$ is calculated by subtracting the minimum voltage value $V1_L$ when the second relay 22 is turned on from the reference voltage value $V1_{DEF}$.

If the voltage change amount $\Delta V_{R-CON}$ is larger than the determination value $\Delta V$, the controller 40 performs the processing of Step S73. If the voltage change amount $\Delta V_{R-CON}$ is smaller than the determination value $\Delta V$, the controller 40 performs the processing of Step S76 and determines that the ground fault detector 30 is not normally connected via the second relay 22.

In Step S73, the controller 40 switches the second relay 22 from on to off.

In Step S74, the controller 40 determines whether or not the voltage change amount $\Delta V_{R-OFF}$ when the second relay 22 is turned off is larger than the determination value $\Delta V$. The voltage change amount $\Delta V_{R-OFF}$ is calculated by subtracting the reference voltage value $V1_{DEF}$ from the maximum voltage value $V1_H$ when the second relay 22 is turned off.

If the voltage change amount $\Delta V_{R-OFF}$ is larger than the determination value $\Delta V$, the controller 40 performs the processing of Step S75. If the voltage change amount $\Delta V_{R-OFF}$ is smaller than the determination value $\Delta V$, the controller 40 performs the processing of Step S76.

In Step S75, the controller 40 determines that the ground fault detector 30 is normally connected via the second relay 22.

In Step S76, the controller 40 determines that the ground fault detector 30 is not normally connected via the second relay 22.

Figure 6:
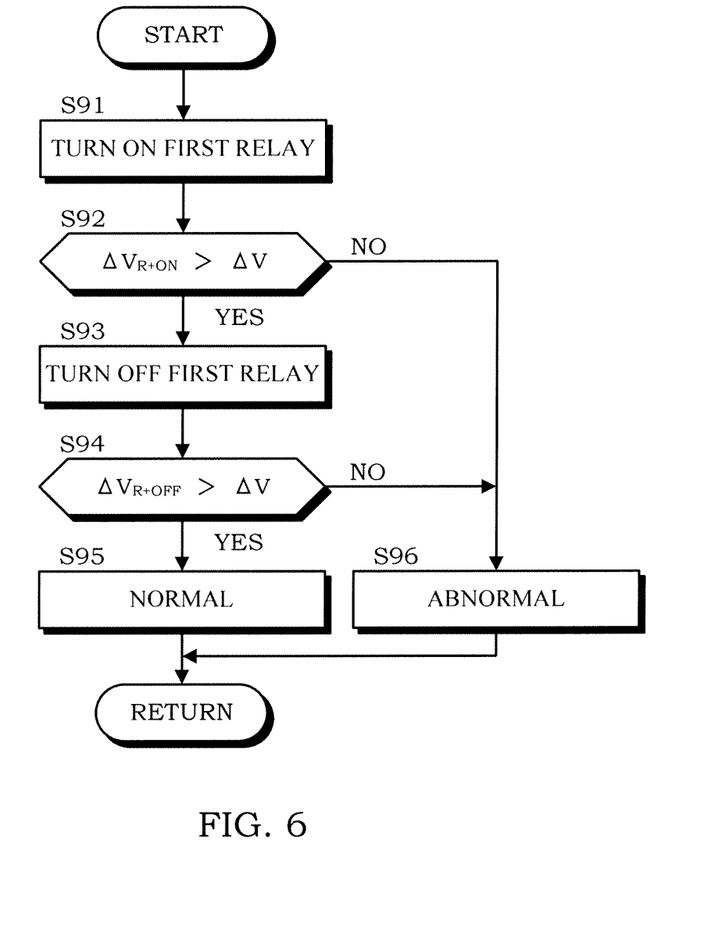
FIG. 6 is a flow chart showing a first relay connection diagnosis subroutine executed by the controller.

A first relay connection diagnosis subroutine is described with reference to FIG. 6.

In Step S91, the controller 40 switches the first relay 21 from off to on.

In Step S92, the controller 40 determines whether or not the voltage change amount $\Delta V_{R+ON}$ when the first relay 21 is turned on is larger than the determination value $\Delta V$. The voltage change amount $\Delta V_{R-ON}$ is calculated by subtracting the minimum voltage value $V1_L$ when the first relay 21 is turned on from the reference voltage value $V1_{DEF}$.

If the voltage change amount $\Delta V_{R+CON}$ is larger than the determination value $\Delta V$, the controller 40 performs the processing of Step S93. If the voltage change amount $\Delta V_{R+CON}$ is smaller than the determination value $\Delta V$, the controller 40 performs the processing of Step S96 and determines that the ground fault detector 30 is not normally connected via the first relay 21.

In Step S93, the controller 40 switches the first relay 21 from on to off.

In Step S94, the controller 40 determines whether or not the voltage change amount $\Delta V_{R+OFF}$ when the first relay 21 is turned off is larger than the determination value $\Delta V$. The voltage change amount $\Delta V_{R+OFF}$ is calculated by subtracting the reference voltage value $V1_{DEF}$ from the maximum voltage value $V1_H$ when the first relay 21 is turned off.

If the voltage change amount $\Delta V_{R+OFF}$ is larger than the determination value $\Delta V$, the controller 40 performs the processing of Step S95. If the voltage change amount $\Delta V_{R+OFF}$ is smaller than the determination value $\Delta V$, the controller 40 performs the processing of Step S96.

In Step S95, the controller 40 determines that the ground fault detector 30 is normally connected via the first relay 21.

In Step S96, the controller 40 determines that the ground fault detector 30 is not normally connected via the first relay 21.

From the above, the connection diagnostic apparatus for the ground fault detector 30 can obtain the following effects.

When the ground fault detector 30 is normally connected to the strong electric circuit 3 via the first to third relays 21 to 23, the voltage value detected by the voltage detector 32 of the ground fault detector 30 changes due to the parasitic capacitance of the strong electric circuit 3 when the first to third relays 21 to 23 are turned on and off. The connection diagnostic apparatus detects a change in the voltage value detected by the voltage detector 32 of the ground fault detector 30 when the first to third relays 21 to 23 are turned on and off. Thus, based on the voltage change amount, the connection diagnostic apparatus can diagnose whether or not the ground fault detector 30 is normally connected to the strong electric circuit 3 via the first to third relays 21 to 23. Therefore, the connected state between the strong electric circuit 3 and the ground fault detector 30 can be diagnosed by a simpler construction than the conventional technique in which a ground circuit for generating a pseudo-ground fault is provided.

Since the connection diagnostic apparatus performs the third relay connection diagnosis ahead of the first relay connection diagnosis and the second relay connection diagnosis, the flow of a high current into the strong electric circuit 3 can be avoided at the time of the connection diagnosis by the action of the resistor 24 provided in series with the third relay 23 even if the first relay 21 is fixed in the on state.

Whether or not the first relay 21 is fixed in the on state is determined based on the both-end voltage of the load 2 at the time of the third relay connection diagnosis and, only when the first relay 21 is not fixed in the on state, the second relay connection diagnosis is performed and subsequently the first relay connection diagnosis is performed. Since it is guaranteed that the first relay 21 is not fixed in the on state, there is no likelihood that a high current flows into the strong electric circuit 3 at the time of the connection diagnosis even if the second relay 22 is turned on by the second relay connection diagnosis. Further, since the first relay connection diagnosis is performed after the second relay connection diagnosis, there is no likelihood that a high current flows into the strong electric circuit 3 at the time of the connection diagnosis even if the first relay 21 is turned on by the first relay connection diagnosis.

In the connection diagnostic apparatus, since the connection diagnosis is performed using the maximum change amount of the temporary voltage value changes produced due to the parasitic capacitance of the strong electric circuit 3 when the first to third relays 21 to 23 are turned on or off, a diagnosis time can be shortened.

Next, a connection diagnostic apparatus for a ground fault detector 30 for an electric vehicle according to a second embodiment of this invention is described with reference to FIGS. 7 to 8.

Figure 7:
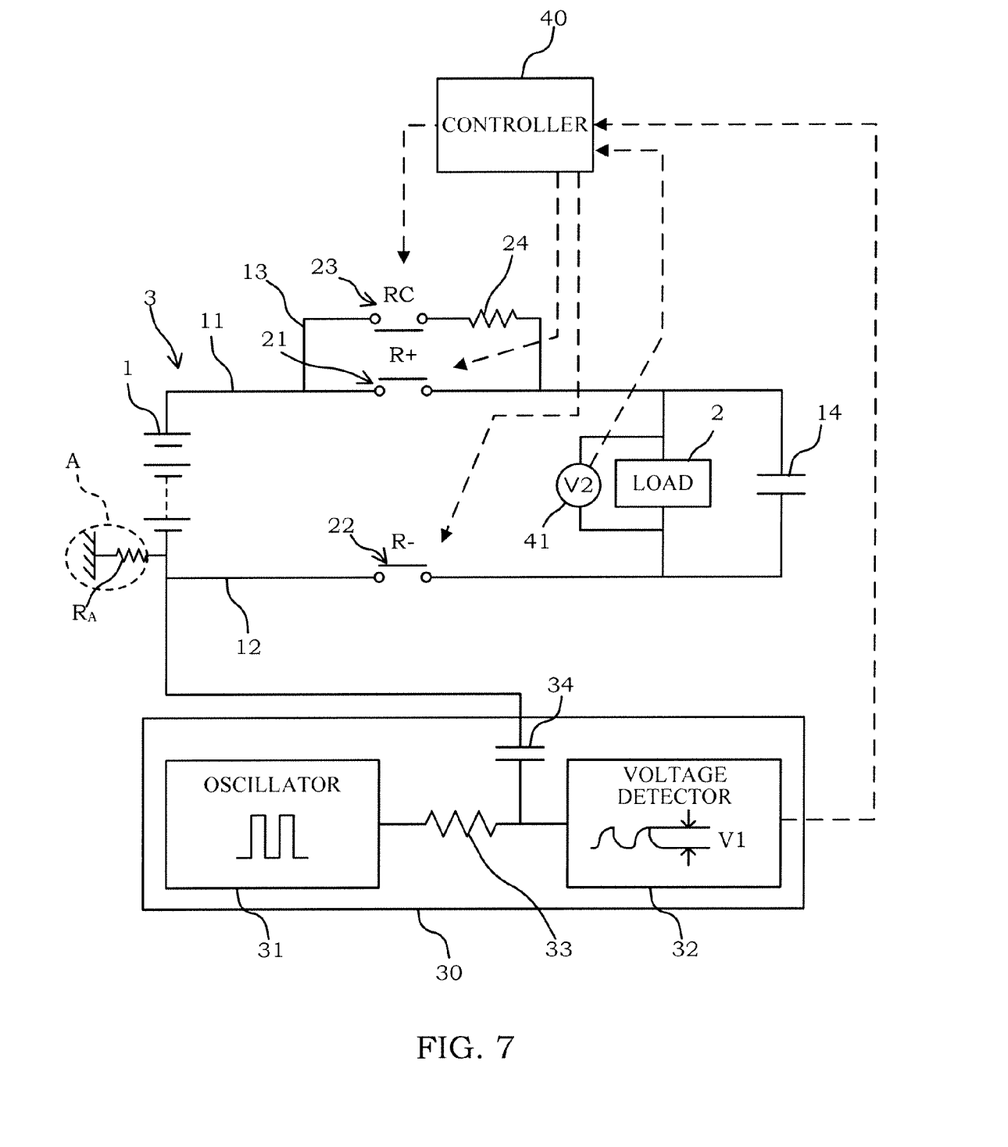
FIG. 7 is a circuit diagram of a connection diagnostic apparatus for a ground fault detector according to a second embodiment of this invention.

As shown in FIG. 7, in the connection diagnostic apparatus for the ground fault detector 30 according to the second embodiment, a third connection line 13 is so connected to a first connection line 11 as to bypass a first relay 21.

Figure 8:
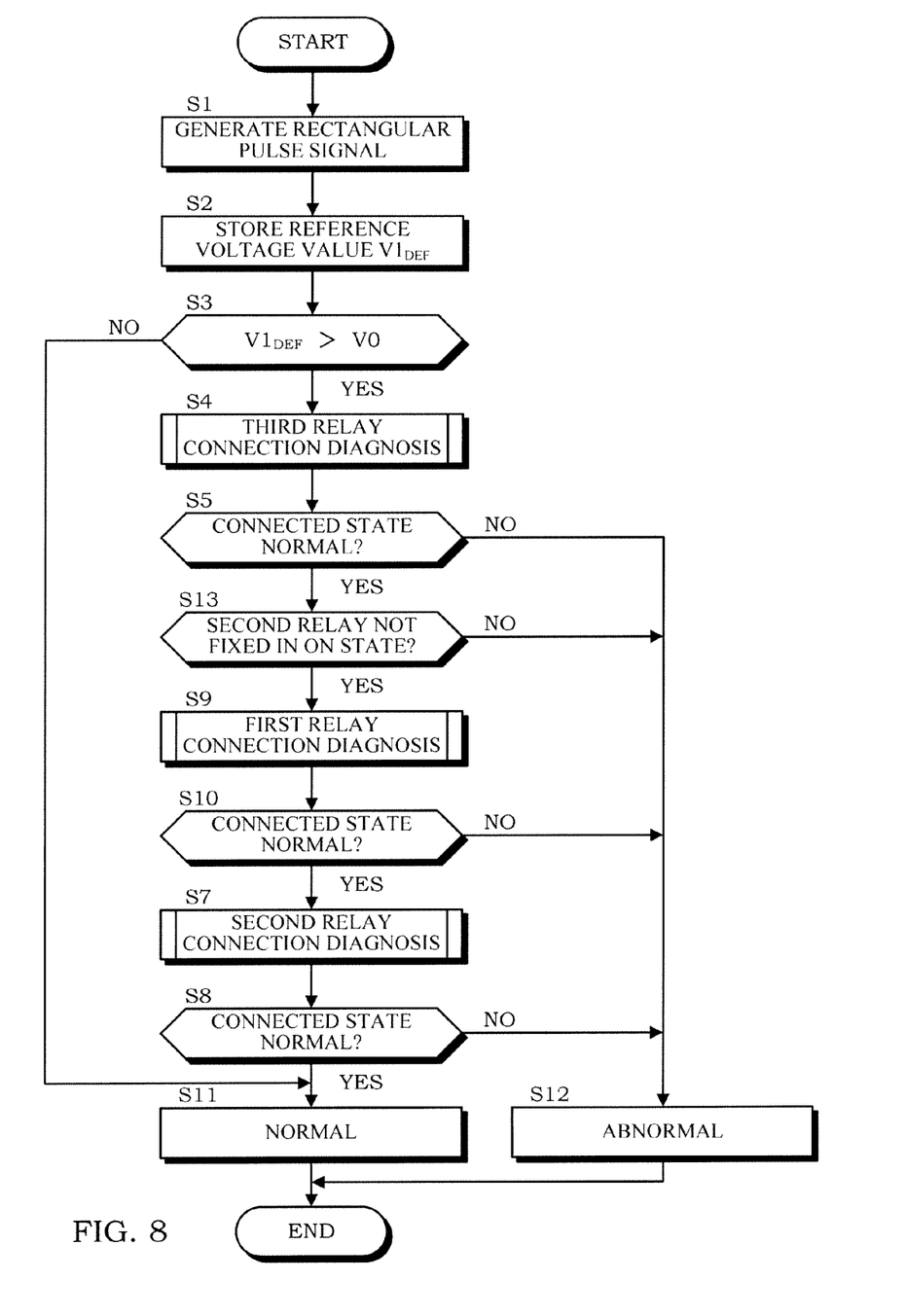
FIG. 8 is a flow chart showing a connection diagnosis routine executed by a controller according to the second embodiment.

In the connection diagnostic apparatus thus constructed, a controller 40 performs a connection diagnosis routine shown in FIG. 8. In this connection diagnosis routine, Steps in which the same processings as in the first embodiment are performed are denoted by the same step numbers as the first embodiment.

As shown in FIG. 8, the controller 40 performs a third relay connection diagnosis in Step S4 ahead of a first relay connection diagnosis and a second relay connection diagnosis. At the time of the third relay connection diagnosis, the controller 40 diagnoses based on a both-end voltage of a load 2 whether or not a second relay 22 is fixed in an on state. In Step S13, the controller 40 determines from the diagnosis result of Step S4 whether or not the second relay 22 is fixed in the on state. Only when the second relay 22 is not fixed in the on state, the controller 40 performs the first relay connection diagnosis in Step S9 and performs the second relay connection diagnosis in subsequent Step S7.

The connection diagnostic apparatus for the ground fault detector 30 described above can obtain effects similar to those of the first embodiment.

Whether or not the second relay 22 is fixed in the on state is determined based on the both-end voltage of the load 2 at the time of the third relay connection diagnosis and, only when the second relay 22 is not fixed in the on state, the first relay connection diagnosis is performed and subsequently the second relay connection diagnosis is performed. Since it is guaranteed that the second relay 22 is not fixed in the on state, there is no likelihood that a high current flows into a strong electric circuit 3 at the time of the connection diagnosis even if the first relay 21 is turned on by the first relay connection diagnosis. Further, since the second relay connection diagnosis is performed after the first relay connection diagnosis, there is no likelihood that a high current flows into the strong electric circuit 3 at the time of the connection diagnosis even if the second relay 22 is turned on by the second relay connection diagnosis.

Concerning the above description, the contents of Japanese Patent Application No. 2009-140927 filed on Jun. 12, 2009 are incorporated hereby by reference.

Although this invention has been described above through several specific embodiments, this invention is not limited to the above respective embodiments. A person skilled in the art can make various modifications or changes to these embodiments within the technical scope of the invention as claimed.

For example, in the first and second embodiments, the third connection line 13 is not necessarily required and only the connection diagnosis by the first relay 21 of the first connection line 11 and that by the second relay 22 of the second connection line 12 may be performed.

Further, although the connection diagnosis is performed using the voltage change amounts when the first to third relays 21 to 23 are both turned on and off in the first and second embodiments, the connection diagnosis may be performed using the voltage change amounts when the first to third relays 21 to 23 are either turned on or off.

Furthermore, although the connection diagnostic apparatus for the ground fault detector 30 is applied to the electric vehicle in the first and second embodiments, it may be applied to a hybrid vehicle or a fuel cell vehicle.

INDUSTRIAL APPLICABILITY

This invention brings about particularly preferable effects in application to a ground fault detector connected to an electric circuit via relays.

The embodiments of this invention in which an exclusive property or privilege are claimed are defined as follows.

The invention claimed is:

1. A connection diagnostic apparatus for a ground fault detector including an oscillator which generates a pulse signal and is connected via a coupling capacitor to an electric circuit with a first connection line for connecting a positive electrode of a power supply and a load and a second connection line for connecting a negative electrode of the power supply and the load, and a voltage detector for detecting a voltage value of the pulse signal between the oscillator and the coupling capacitor, comprising:

a first relay provided in the first connection line;

a second relay provided in the second connection line; and a programmable controller programmed to:

turn on and off the first relay, determine that the ground fault detector is not normally connected to the electric circuit via the first relay if either a temporary voltaae decrease amount from a reference voltage value detected by the voltage detector when the first relay is turned on or a temporary voltage increase amount from the reference voltage value detected by the voltage detector when the first relay is turned off is smaller than apredetermined determination value, turn on and off the second relay, and determine that the ground fault detector is not normally connected to the electric circuit via the second relay if either a temporay voltage decrease amount from the reference voltage value detected by the voltage detector when the second relay is turned on or a temporary voltage increase amount from the reference voltage value detected by the voltage detector when the second relay is turned off is smaller than the predetermined determination value.

2. The connection diagnostic apparatus as defined in claim 1, further comprising:

a third connection line connected to the first connection line or the second connection line in such a manner as to bypass the first relay or the second relay;

third relay provided in the third connection line; and a resistor provided in the third connection line and arranged in series with the third relay;

wherein the programmable controller turns on and off the third relay and determines that the ground fault detector is not normally connected to the electric circuit via the third relay if either a temporary voltage decrease amount from the reference voltage value detected by the voltage detector when the third relay is turned on or a temporary voltage increase amount from the reference voltage value detected by the voltage detector when the third relay is turned off is smaller than the predetermined determination value.

3. The connection diagnostic apparatus as defined in claim 2, wherein the programmable controller perform a connection diagnosis by the third relay ahead of that by the first relay and that by the second relay.

4. The connection diagnostic apparatus as defined in claim 3, further comprising a load voltage detector for detecting a both-end voltage of the load, wherein:

the third connection line is connected to the second connection line;

the programmable controller:

determines whether or not the first relay is fixed in an on state based on the both-end voltage of the load when the third relay is turned on in the connection diagnosis by the third relay, and performs the connection diagnosis by the second relay and subsequently performs the connection diagnosis by the first relay only when the first relay is not fixed in the on state.

5. The connection diagnostic apparatus as defined in claim 3, further comprising a load voltage detector for detecting a both-end voltage of the load, wherein:

the third connection line is connected to the first connection line;

the programmable controller:

determines whether or not the second relay is fixed in an on state based on the both-end voltage of the load when the third relay is turned on in the connection diagnosis by the third relay, and performs the connection diagnosis by the first relay and subsequently performs the connection diagnosis by the second relay only when the second relay is not fixed in the on state.

* * * * *